(12) United States Patent
Greco et al.

(10) Patent No.: US 7,701,035 B2
(45) Date of Patent: Apr. 20, 2010

(54) LASER FUSE STRUCTURES FOR HIGH POWER APPLICATIONS

(75) Inventors: Stephen E. Greco, Lagrangeville, NY (US); Erik L. Hedberg, Essex Junction, VT (US); Dae-Young Jung, Lagrangeville, NY (US); Paul S. McLaughlin, Poughkeepsie, NY (US); Christopher D. Muzzy, Burlington, VT (US); Norman J. Rohrer, Underhill, VT (US); Jean E. Wynne, Fair Haven, VT (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 11/164,640

(22) Filed: Nov. 30, 2005

(65) Prior Publication Data

US 2007/0120232 A1    May 31, 2007

(51) Int. Cl.
*H01L 23/525* (2006.01)
*H01L 21/768* (2006.01)

(52) U.S. Cl. .......... 257/529; 257/209; 257/E23.15; 257/E21.592; 438/132

(58) Field of Classification Search ............ None
See application file for complete search history.

(56) References Cited

U.S. PATENT DOCUMENTS

| | | | |
|---|---|---|---|
| 4,853,758 A | 8/1989 | Fischer | 257/529 |
| 5,274,264 A | 12/1993 | Yung | 257/529 |
| 5,331,195 A * | 7/1994 | Yukihiro | 257/529 |
| 5,493,148 A * | 2/1996 | Ohata et al. | 257/538 |
| 5,572,050 A * | 11/1996 | Cohen | 257/209 |
| 5,636,172 A | 6/1997 | Prall et al. | 365/225.7 |
| 5,659,182 A * | 8/1997 | Cohen | 257/50 |
| 5,827,759 A | 10/1998 | Froehner | 438/132 |
| 6,197,621 B1 | 3/2001 | Harvey | 438/131 |
| 6,204,548 B1 | 3/2001 | Komai | 257/529 |
| 6,208,568 B1 | 3/2001 | Zagar et al. | 365/200 |
| 6,242,790 B1 * | 6/2001 | Tsui et al. | 257/529 |
| 6,444,544 B1 * | 9/2002 | Hu et al. | 438/467 |
| 6,489,640 B1 | 12/2002 | Smith | 257/209 |
| 6,956,277 B1 * | 10/2005 | Wu et al. | 257/529 |

(Continued)

FOREIGN PATENT DOCUMENTS

EP    0932223    7/1999

(Continued)

*Primary Examiner*—Andy Huynh
*Assistant Examiner*—Hoang-Quan T Ho
(74) *Attorney, Agent, or Firm*—Scully, Scott, Murphy & Presser, P.C.; Richard M. Kotulak, Esq.

(57) ABSTRACT

The present invention relates to a laser fuse structure for high power applications. Specifically, the laser fuse structure of the present invention comprises first and second conductive supporting elements (12a, 12b), at least one conductive fusible link (14), first and second connection elements (20a, 20b), and first and second metal lines (22a, 22b). The conductive supporting elements (12a, 12b), the conductive fusible link (14), and the metal lines (22a, 22b) are located at a first metal level (3), while the connect elements (20a, 20b) are located at a second, different metal level (4) and are connected to the conductive supporting elements (12a, 12b) and the metal lines (22a, 22b) by conductive via stacks (18a, 18b, 23a, 23b) that extend between the first and second metal levels (3, 4).

14 Claims, 4 Drawing Sheets

U.S. PATENT DOCUMENTS

| | | | |
|---|---|---|---|
| 2001/0039640 A1 | 11/2001 | Bernstein et al. | 716/2 |
| 2002/0100957 A1* | 8/2002 | Rusch et al. | 257/529 |
| 2003/0123207 A1* | 7/2003 | Toyoshima | 361/104 |
| 2004/0262768 A1* | 12/2004 | Cho et al. | 257/758 |
| 2005/0087836 A1* | 4/2005 | Wu | 257/529 |
| 2005/0093091 A1 | 5/2005 | Badami et al. | 257/529 |
| 2005/0277232 A1* | 12/2005 | Wu et al. | 438/132 |
| 2006/0118904 A1* | 6/2006 | Liaw | 257/529 |

FOREIGN PATENT DOCUMENTS

| | | |
|---|---|---|
| JP | 07-78872 A | 3/1995 |
| JP | 10321726 A | 12/1998 |

\* cited by examiner

LASER FUSE STRUCTURES FOR HIGH POWER APPLICATIONS

FIELD OF THE INVENTION

The present invention relates to the design of a laser fuse for high power applications. More specifically, the present invention relates to a laser fuse that can be used in an integrated circuit (IC) chip for connecting/disconnecting various functional circuits to/from power planes of the IC chip.

BACKGROUND OF THE INVENTION

The current trend in semiconductor manufacturing is to fabricate integrated circuit (IC) chips having reduced sizes. As such, the functional circuits containing such IC chips continue to increase in complexity. This increases the opportunity for defective chips resulting from a failed element or a defective conductor. One solution for this problem is to provide redundant circuits or redundant elements on the IC chips. For example, if a primary circuit or element becomes defective, a redundant circuit or element can be used to substitute for that defective circuit or element, which involves logic de-activation of the defective circuit or element and activation of the redundant circuit or element. One major disadvantage of the logic de-activation approach is that the defective circuit or element are still tied to the power planes of the IC chips and continue to drain power from the IC chips after the logic de-activation, which can cause functional chips to be rejected due to violations of predetermined power specifications, especially in low power logic applications.

There is therefore a need for physically and permanently canceling the defective circuits and elements and separating them from the power planes of the IC chips.

Further, advances in IC chip manufacturing technology have allowed a continuously increasing number of functionalities to be implemented on a single IC chip, and much effort has been devoted to streamline and reduce IC chip part numbers that have proliferated due to the multitudes of various customer applications. Tremendous cost savings can be realized if a "one-chip-fits-all" model is provided for the IC chip manufacturing process, and custom-modification or "personalization" of the IC chips is carried out post-manufacturing for tailoring the functionalities of the IC chips according to the specific customer application. Currently, the custom-modification or personalization is conducted at the logic level through logic activation and de-activation of various functional circuits or elements. However, after the logic custom-modification or personalization, the un-used circuits or elements are still tied to the power planes of the IC chips and continue to drain power from the IC chips. Such un-used circuits or elements can also cause the chips to be rejected due to violations of predetermined power specifications, especially in low power logic applications.

There is therefore also a need for providing custom-modification or personalization of IC chips at the wafer level so as to completely eliminate the un-used circuits or elements, separate them from the chip power planes, and reduce the overall chip loading.

Laser fuses have been used for permanently canceling defective circuits or elements and for custom-modifying/personalizing the IC chips in low power applications, which are typically characterized by low voltage drops (approximately in the order of about 0.1V) and low duty cycle limits (approximately in the order of about 0.001%). Use of currently available laser fuses in high power applications characterized by high voltage drops (in the order of at least about 2V) and high duty cycles (approximately in the order of at least about 100%), on the other hand, have resulted in reliability failures due to fuse regrowth under high voltage and high duty cycle conditions.

It would therefore be advantageous to provide improved laser fuse structures that have high current capability and are suitable for use in high power applications.

SUMMARY OF THE INVENTION

The present invention, in one aspect, relates to a laser fuse structure, comprising:

first and second conductive supporting elements located at a first metal level of an integrated circuit (IC) chip in a spaced-apart relationship;

at least one conductive fusible link located at the first metal level between the first and second conductive supporting elements for directly connecting same;

first and second connection elements located at a second, different metal level of the IC chip, wherein the first and second conductive support elements are respectively connected to the first and second connection elements by first and second via stacks that each comprises one or more conductive vias extending between the first and second metal levels; and first and second metal lines located at the first metal level, wherein the first and second connection elements are respectively connected to the first and second metal lines by third and fourth via stacks that each comprises one or more conductive vias extending between the first and second metal levels.

In another aspect, the present invention relates to a method for programming the above-described laser fuse structure, by applying at least one laser beam that has an energy level ranging from about 0.5 µJ to about 2.5 µJ to the conductive fusible link of the laser fuse structure.

In yet another aspect, the present invention relates to an integrated circuit (IC) chip that comprises the above-described laser fuse structure, where the first metal level of the laser fuse structure is the last copper level of the IC chip.

A further aspect of the present invention relates to an IC chip that comprises a laser fuse that includes a single fusible link or multiple fusible links arranged in parallel and is located at the last metal level of the IC chip. Specifically, one side of the laser fuse is connected to a functional part of the IC chip, and the other side of the laser fuse is connected to a power bus of the IC chip.

In a still further aspect, the present invention relates to a method for programming the above-described IC chip by applying at least one laser beam that has an energy level ranging from about 0.5 µJ to about 2.5 µJ to the laser fuse.

Other aspects, features and advantages of the invention will be more fully apparent from the ensuing disclosure and appended claims.

DETAILED DESCRIPTION OF THE INVENTION AND PREFERRED EMBODIMENTS THEREOF

Figure 1:
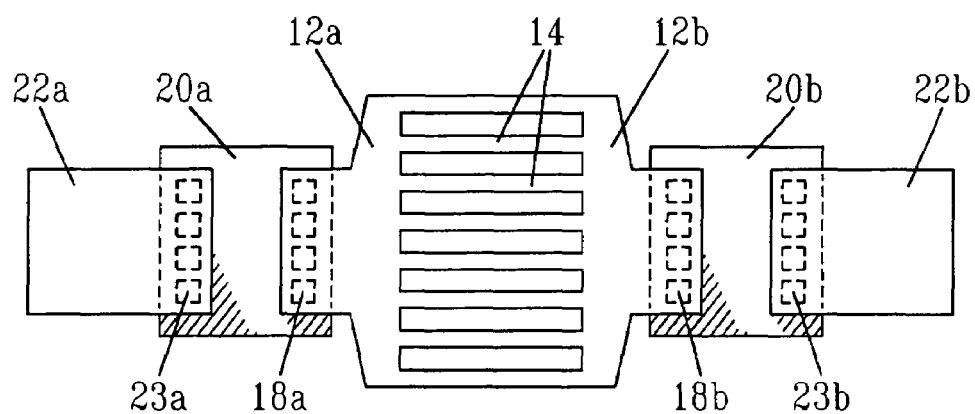
FIG. 1 shows a top view of an exemplary laser fuse, according to one embodiment of the present invention.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on or over the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention provides laser fuse designs that can be readily integrated into the back-end-of-line (BEOL) complementary metal-oxide-semiconductor (CMOS) part of an integrated circuit (IC) chip for connecting/disconnecting various functional components on the IC chip to/from the power planes of the IC chip. Moreover, the laser fuses of the present invention have sufficiently high current capacity (≧about 30 mA) and are particularly suitable for high power applications.

Specifically, the laser fuses of the present invention each contains one or more conductive fusible links that are located between and supported by two conductive supporting elements at the last copper level in an IC chip. The conductive supporting elements of the laser fuse are electrically connected to out-going wires or metal lines through connection elements that are located at a different metal level, to achieve complete physical separation and isolation of the laser fuse from out-going wires or metal lines. For example, the connection elements can locate at the second last copper level in the IC chip. Alternatively, the connection elements can locate at an aluminum wiring level above the last copper level in the IC chip.

Further, the laser fuses of the present invention each is characterized by one or more dimensional parameters, such as the length, width, and thickness of the fusible links contained by the laser fuse and the distance there between, which contribute to the high current capacity and high reliability of the laser fuse and make it particularly suitable for high power applications.

Exemplary laser fuses of the present invention will now be illustrated in greater detail by referring to the accompanying FIGS. 1-5B. Note that in these drawings, which are not drawn to scale, like and/or corresponding elements are referred to by like reference numerals. It is further noted that although a specific number of fusible links and contacts are shown in the exemplary laser fuses shown by such drawings, the present invention is not so limited and is intended to cover laser fuses with any specific number of fusible links and contacts.

Reference is first made to FIG. 1, which shows a top view of a laser fuse structure that contains multiple parallely arranged conductive fusible links 14 and located between and directly connecting first and second conductive support bars 12a and 12b. The first and second conductive support bars 12a and 12b are respectively connected to first and second conductive pads 20a and 20b by first and second via stacks 18a and 18b. The first and second conductive pads 20a and 20b are then respectively connected to first and second metal lines 22a and 22b by third and fourth via stacks 23a and 23b.

The conductive fusible links 14, first and second conductive support bars 12a and 12b, and first and second metal lines 22a and 22b are all located at the same metal level, which is referred to as the first metal level herein, while the first and second conductive pads 20a and 20b are located at a different metal level, which is referred to as the second metal level hereinafter. The second metal level can locate either below the first metal level, as shown in FIG. 1, or above the first metal level, which is to be shown in FIGS. 3-4 hereinafter.

In a preferred embodiment of the present invention, the first metal level is the last copper level in the IC chip, while the second metal level is the second last copper level below the last copper level. In this embodiment, the conductive fusible links 14, the first and second conductive support bars 12a and 12b, the first and second conductive pads 20a and 20b, and the first and second metal lines 22a and 22b all comprise copper or a copper alloy.

In an alternative, but equally preferred, embodiment of the present invention, the first metal level is the last copper level in the IC chip, while the second metal level is the aluminum wiring level above the last copper level. In this alternatively embodiment, the conductive fusible links 14, the first and second conductive support bars 12a and 12b, and the first and second metal lines 22a and 22b comprise copper or a copper alloy, while the first and second conductive pads 20a and 20b comprise aluminum or aluminum alloy.

The conductive fusible links 14 are preferably characterized by one or more dimensional parameters selected from the group consisting of a length of at least about 8 μm, a width of not more than about 2 μm, and a thickness of not more than about 2 μm. More preferably, the conductive fusible links 14 have a length of at least about 12 μm, a width of not more than about 1 μm, and a thickness of not more than about 1.5 μm. Note that conventional laser fuses typically have fusible links that are about 8 μm long. Therefore, the conductive fusible links 14 of the laser fuse 10 of the present invention are significantly longer than those of the conventional laser fuses.

Further, the conductive fusible links 14 are preferably spaced apart from one another by a distance of not more than about 2 μm, more preferably not more than about 1.5 μm, and most preferably about 1 μm. Note that conventional laser fuses in similar thickness range typically have fusible links that are spaced apart from one another by a distance of at least about 6 to 9 μm. Therefore, the conductive fusible links 14 of the laser fuse 10 of the present invention are spaced apart from one another by a distance that is significantly narrower than that of the conventional laser fuses.

In a specific embodiment of the present invention, one of the first and second metal lines 22a and 22b of the laser fuse is connected to a functional part of the IC chip (not shown), such as a functional circuit or element, and the other of the first and second metal lines 22a and 22b is connected to a power plane of the IC chip (not shown). In this manner, and if the functional part of the IC chip becomes non-functional, the laser fuse structure of the present invention can be blown by one or more laser beams to disconnect the non-functional part from the power plane of the IC chip, thereby avoiding unnecessary power drain and minimizing the power consumption of the IC chip.

Preferably, the functional part of the IC chip to which the first or second metal line 22a or 22b is connected operates at a high operating current of not less than 30 mA. The laser fuse structure of the present invention has a current capacity of not less than 30 mA, so it can be readily used with the high power functional part of the IC chip. Note that the current is typically limited by the width and number of fuse links.

The first and second conductive support bars 12a and 12b provide structural support for the conductive fusible links 14, and also provide electrical connection between the conductive fusible links 14 and the first and second via stacks 18a and 18b. In this manner, the conductive fusible links 14 are no longer directly connected one-to-one with the conductive vias contained in the via stacks 18a and 18b, and the number of conductive vias contained by the first and second via stacks 18a and 18b are no longer limited by the number of conductive fusible links 14. Correspondingly, the first and second via stacks 18a and 18b may contain any number of conductive vias, either the same as, or different from, the number of conductive fusible links 14, and the conductive vias can be arranged in any manner, i.e., into a vertical column, a horizontal row, or multiple rows and columns.

The conductive vias contained by the via stacks 18a, 18b, 23a, and 23b may comprise any suitable conductive material(s). Preferably, they comprise one or more self-passivated electrically conducting materials selected from the group consisting of Al, W, and combinations thereof.

Figure 2:
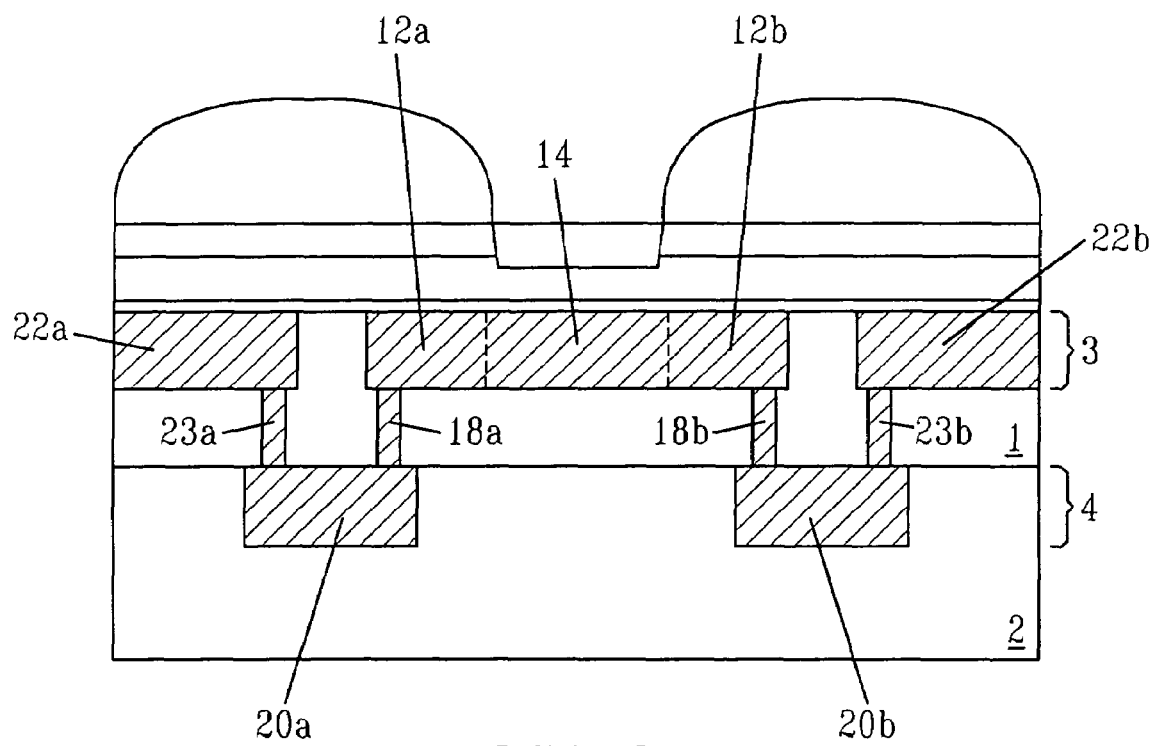
FIG. 2 shows a cross-sectional view of the exemplary laser fuse of FIG. 1.

FIG. 2 shows a cross-sectional view of the laser fuse of FIG. 1. The conductive fusible links 14, the first and second conductive support bars 12a and 12b, and the first and second metal lines 22a and 22b are all located at the first metal level 3, which is the last copper level of the IC chip and which is embedded in the last level inter-level dielectric (ILD) layer 1. In contrast, the first and second conductive pads 20a and 20b are located at a second, different metal level 4, which is the second last copper level of the IC chip and which is embedded in the second last ILD layer 2. The conductive vias contained by the via stacks 18a, 18b, 23a, and 23b extend between the first and second metal levels 3 and 4.

In order to reduce damage or cracking of the ILD layers during fuse blowing, one or more interstitial cavities (not shown) are preferably provided at either side or both sides of the conductive fusible links 14. Such one or more interstitial cavities may be provided only in the ILD layer 1, or extend through the ILD layers 1 and 2.

Figure 3:
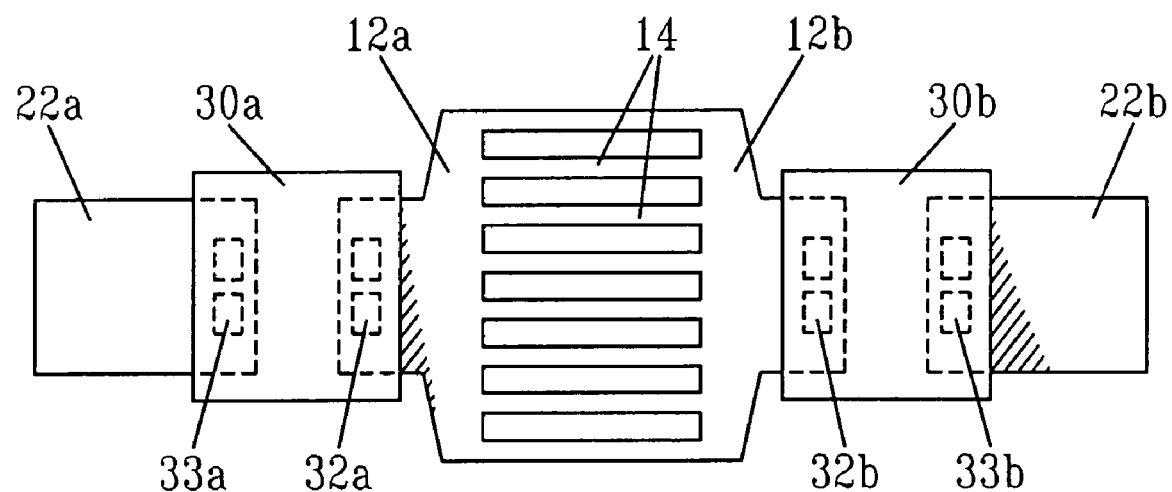
FIGS. 3-4 shows top views of various exemplary laser fuses, according to further embodiments of the present invention.

FIG. 3 shows another laser fuse structure according to an alternative embodiment of the present invention, which contains multiple parallel arranged conductive fusible links 14 located between and directly connecting first and second conductive support bars 12a and 12b. The first and second conductive support bars 12a and 12b are respectively connected to first and second conductive pads 30a and 30b by first and second via stacks 32a and 32b. The first and second conductive pads 30a and 30b are then respectively connected to first and second metal lines 22a and 22b by third and fourth via stacks 33a and 33b. The conductive fusible links 14, first and second conductive support bars 12a and 16b, and first and second metal lines 22a and 22b are all located at the same first metal level, while the first and second conductive pads 30a and 30b are located at a second, different metal level above the first metal level, as shown in FIG. 3.

Figure 4:
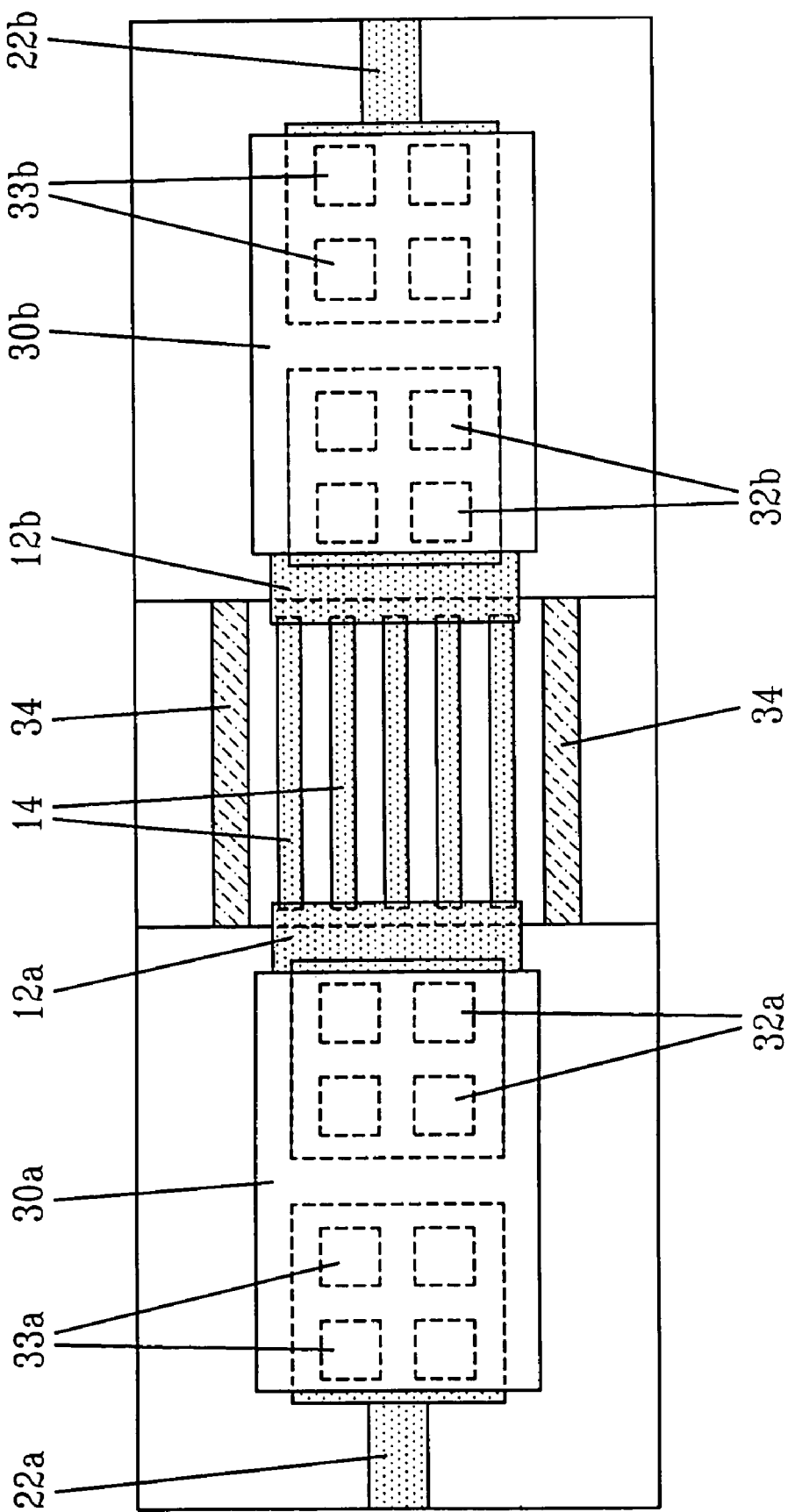

FIG. 4 shows another laser fuse having a similar structure as the laser fuse of FIG. 3, except that the conductive vias in the via stacks 32a, 32b, 33a, and 33b are arranged in a 2×2 square, not in a vertical column as in FIG. 3, and that one or more interstitial cavities 34 are provided at both sides of the conductive fusible links 14, so as to prevent or reduce damage to the ILD layer in which the conductive fusible links 14 are embedded during the fuse blowing process.

The laser fuse structure of the present invention can be readily blown or deleted by one or more laser beams having an energy level of from about 0.5 µJ to about 2.5 µJ, more preferably from about 0.9 µJ to about 2.3 µJ, and most preferably about 2.0 µJ. The laser beam may contain a single laser spot or multiple laser spots having a diameter ranging from about 1.0 µm to about 5.0 µm, more preferably from about 2.0 µm to about 4.0 µm, and most preferably about 4.0 µm. If the laser beam contains multiple laser spots, such multiple laser spots are preferably spaced apart from one another by a distance ranging from about 0.5 µm to about 5.0 µm, more preferably from about 1.0 µm to about 3.5 µm, and most preferably about 2.0 µm.

Figure 5A:
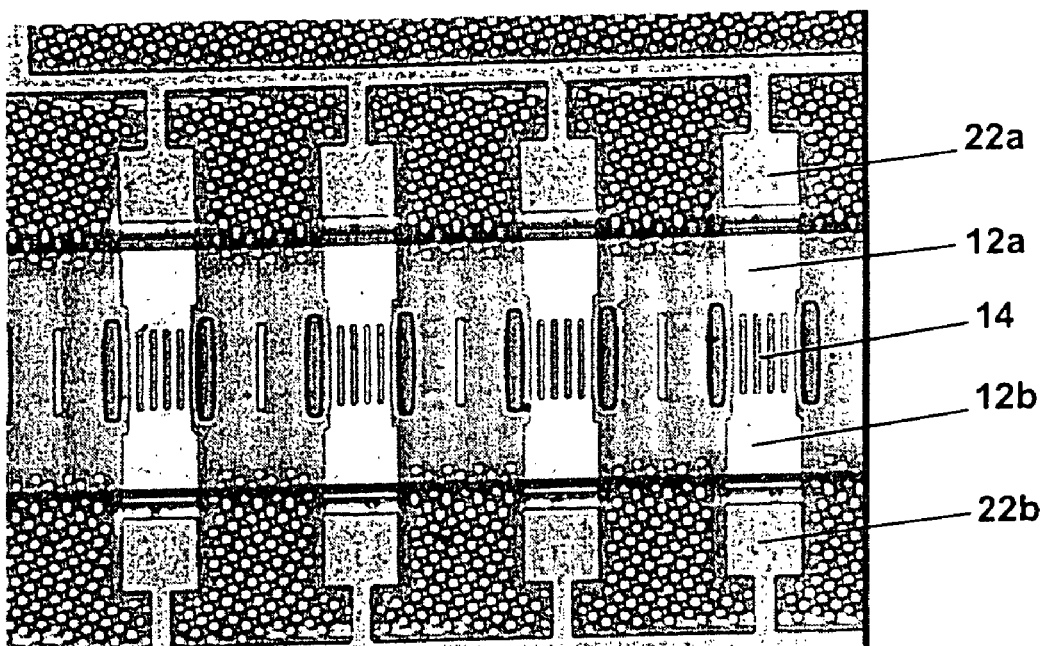
FIG. 5A shows a photographic view of multiple intact laser fuses, according to one embodiment of the present invention.
Figure 5B:
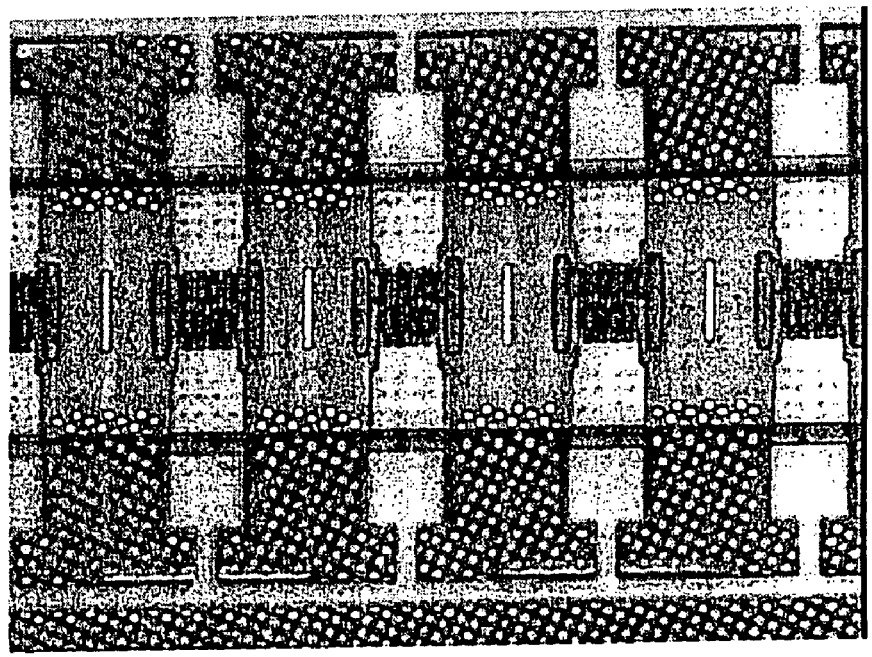
FIG. 5B shows a photographic view of the laser fuses of FIG. 5 after being irradiated by laser beams.

FIGS. 5A and 5B show the before- and after-programming photographs of multiple laser fuses of the present invention, which are programmed by laser beams that have an energy level of about 1.0 µJ and contain two 4.0 µm laser spots spaced apart from each other by about 1 µm.

While FIGS. 1-5B illustratively demonstrate exemplary laser fuse structures, according to specific embodiments of the present invention, it is clear that a person ordinarily skilled in the art can readily modify the laser fuse structures illustrated herein, for adaptation to specific application requirements, consistent with the above descriptions. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A laser fuse structure, comprising:
    first and second conductive supporting elements located at a first metal level of an integrated circuit (IC) chip in a spaced-apart relationship;
    multiple conductive fusible links located at the first metal level between the first and second conductive supporting elements for directly connecting same, wherein the multiple conductive fusible links are arranged in parallel and are spaced apart from one another by a distance of not more than 2 µm, wherein each of the multiple conductive fusible links have the same dimensions and comprise a length of at least about 12 µm, a thickness of not more than about 1.5 µm, and a width of not more than about 1 µm, in which the multiple conductive fusible links have a current capacity of not less than 30 mA;
    first and second connection elements located at a second, different metal level of the IC chip, wherein the first and second conductive support elements are respectively connected to said first and second connection elements by first and second via stacks that each comprises one or more conductive vias extending between the first and second metal levels; and
    first and second metal lines located at the first metal level, wherein the first and second connection elements are respectively connected to said first and second metal lines by third and fourth via stacks that each comprises one or more conductive vias extending between the first and second metal levels.

2. The laser fuse structure of claim 1, wherein the first metal level is a last copper level of the IC chip.

3. The laser fuse structure of claim 2, wherein the second, different metal level is a second last copper level located underneath the last copper level.

4. The laser fuse structure of claim 2, wherein the second, different metal level is an aluminum wiring level located over the last copper level.

5. The laser fuse structure of claim 1, wherein one of the first and second metal lines is connected to a functional part of the IC chip, and wherein the other of the first and second metal lines is connected to a power plane of the IC chip.

6. The laser fuse structure of claim 5, wherein the functional part of the IC chip has an operating current of not less than 30 mA.

7. The laser fuse structure of claim 1, wherein the multiple conductive fusible links are spaced apart from one another by a distance of not more than 1.5 µm.

8. The laser fuse structure of claim 1, wherein the conductive vias contained in the first and second via stacks comprise self-passivated electrically conducting material(s) selected from the group consisting of Al, W, and combinations thereof.

9. The laser fuse structure of claim 1, wherein the first metal level is embedded in an inter-level insulator layer that contains one or more interstitial cavities at either side or both sides of the at least one conductive fusible link.

10. A method for programming the laser fuse structure of claim 1, comprising applying at least one laser beam having an energy level ranging from about 0.5 µJ to about 2.5 µJ to the at least one conductive fusible link.

11. An integrated circuit (IC) chip, comprising a laser fuse including multiple conductive fusible links arranged in parallel, wherein the multiple conductive fusible links are spaced apart from one another by a distance of not more than 2 µm, wherein each of the multiple conductive fusible links have the same dimensions and comprise a length of at least about 12 µm, a thickness of not more than about 1.5 µm, and a width of not more than about 1 µm, in which the multiple conductive fusible links have a current capacity of not less than 30 mA, wherein said laser fuse is located at a last metal level of said IC chip, wherein one side of said laser fuse is connected to a functional part of the IC chip, and wherein the other side of said laser fuse is connected to a power bus of the IC chip.

12. The IC chip of claim 11, wherein the multiple conductive fusible links are spaced apart from one another by a distance of not more than 1.5 µm.

13. A method for programming the IC chip of claim 11, comprising applying at least one laser beam having an energy level ranging from about 0.5 µJ to about 2.5 µJ to the laser fuse.

14. A method of claim 13, wherein the at least one laser beam is applied after the functional part of the IC chip δbecomes non-functional.

* * * * *